United States Patent [19]

Gilhousen et al.

[11] Patent Number: 4,979,170
[45] Date of Patent: Dec. 18, 1990

[54] ALTERNATING SEQUENTIAL HALF DUPLEX COMMUNICATION SYSTEM

[75] Inventors: Klein S. Gilhousen, San Diego; Franklin P. Antonio, Del Mar; Irwin M. Jacobs, La Jolla; Lindsay A. Weaver, Jr., San Diego, all of Calif.

[73] Assignee: Qualcomm, Inc., San Diego, Calif.

[21] Appl. No.: 145,176

[22] Filed: Jan. 19, 1988

[51] Int. Cl.⁵ .................... H04B 7/212; H04B 7/216
[52] U.S. Cl. .................... 370/104.1; 455/12; 455/32
[58] Field of Search .......... 370/31, 37, 75, 95, 370/104, 50, 76, 92–94, 97, 17, 29, 104.1; 455/12, 32; 340/825.44; 375/1, 8

[56] References Cited

U.S. PATENT DOCUMENTS

| | | | |
|---|---|---|---|
| 4,009,343 | 2/1977 | Markey et al. | 179/15 BS |
| 4,117,267 | 9/1978 | Haberle et al. | 455/12 |
| 4,172,214 | 10/1979 | McDonald et al. | 179/15 AQ |
| 4,287,588 | 9/1981 | Segner | 370/29 |
| 4,288,862 | 9/1981 | Grotjohann et al. | 370/30 |
| 4,309,764 | 1/1982 | Acampora | 370/104.1 |
| 4,408,322 | 10/1983 | Chadwick et al. | 370/17 |
| 4,504,946 | 3/1985 | Raychaudhuri | 370/95 |
| 4,549,303 | 10/1985 | Gutleber | 375/25 |
| 4,581,749 | 4/1986 | Carney et al. | 375/44 |
| 4,608,684 | 8/1986 | Upp | 370/58 |
| 4,617,658 | 10/1986 | Walters | 370/84 |
| 4,625,308 | 11/1986 | Kim et al. | 370/104 |
| 4,644,529 | 2/1987 | Amstutz et al. | 370/60 |
| 4,646,294 | 2/1987 | Eliscu et al. | 370/94 |
| 4,675,863 | 6/1987 | Paneth et al. | 370/50 |
| 4,686,670 | 8/1987 | Kessels et al. | 370/68 |
| 4,686,672 | 8/1987 | Namiki | 370/95 |
| 4,686,673 | 8/1987 | Hotta | 370/104 |
| 4,704,608 | 11/1987 | Sato et al. | 340/825.44 |
| 4,713,808 | 12/1987 | Gaskill et al. | 370/94 |
| 4,736,371 | 4/1988 | Tejima et al. | 370/95 |
| 4,754,453 | 6/1988 | Eizenhofer | 370/95 |

Primary Examiner—Douglas W. Olms
Assistant Examiner—Melvin Marcelo
Attorney, Agent, or Firm—Russell B. Miller

[57] ABSTRACT

A message communication system employing one or more centralized communication stations transferring messages through Earth orbit repeater satellites to or from mobile terminals with at least one central communication station having a first transceiver for transmitting a first communication signal to one or more mobile terminals and at least one mobile terminal having a second transceiver for receiving the first communication signal and demodulating it, and for transmitting at a predetermined duty cycle of the second transceiver, a second communication signal to at least one of the central communication stations. The preferred duty cycle over which the second communication signal is transmitted is about fifty percent of the second transceiver duty cycle. The communication system uses Time Division Multiplexed (TDM) communication signals using a number of channels as designated address channels with the remainder being used for data transfer. Information transmitted on the address channels is used by terminals to determine both the presence of a message and its corresponding data transmission or reception channel. In addition the terminals use the reception of the first communication signal to adjust return link transmission frequency to compensate for transmission path errors. The alternating duty cycle allows mobile terminals to use a single set of local oscillators for both transmission and reception modes of operation. To decrease interference with other systems the present system employs a power dispersal modulation function to achieve the footprint of a video signal for high transfer rate digital communication signals.

58 Claims, 4 Drawing Sheets

ALTERNATING SEQUENTIAL HALF DUPLEX COMMUNICATION SYSTEM

BACKGROUND OF THE INVENTION

1. Field of the Invention

The present invention relates to communication systems and more particularly to two-way telecommunication systems employing central message transmitting stations and Earth orbit relay satellites to transfer messages between mobile terminals and the central stations. The invention further relates to a two-way telecommunication system using a sequential, alternating, half duplex communication pattern to reduce complexity and power requirements for each terminal while providing reliable communications between a large number of mobile system users.

2. Background of the Art

There is an ever increasing need for communication systems to provide message delivery or brief transfers of information between a central communication office or dispatcher and a number of remote system users. There are a substantial number of commercial, governmental, and private applications requiring the delivery of relatively short messages to or from a large number of geographically dispersed terminals, or mobile transceivers, often on an irregular basis. The need for message services includes such diverse applications as government services (military, law enforcement, legislative) where secure communications are desired, forestry, resource management, disaster relief or coordination, aviation, navigation, commercial transport or transportation, and message delivery services.

Other examples include the interstate trucking industry where dispatchers wish to communicate short messages to trucks located anywhere in the continental United States, especially in rural areas. Presently the transfer of such messages is restricted to periodic telephonic communication between drivers and a central dispatcher or contact person. Currently, truck drivers must call long distance from many remote geographic locations to retrieve messages or to update delivery and pick-up schedules. However, it is hard, if not impossible, for drivers to consistently "call in" at fixed, scheduled, times since telephone services are not always readily available in many areas. The conventional "call in" approach also creates accounting problems and major personal inconvenience by requiring vehicle drivers to use money or charge cards for long distance calls at substantial cost even when no updated message or information is transferred.

Aside from conventional telephone systems, other communication systems have attempted to address the mobile market. Radio telephone, cellular telephone, and portable radio transceivers (CB) are all capable of providing some form of communication between a mobile transceiver and a base unit. However, these communication systems suffer from several drawbacks and have proven inadequate as message communication systems for serving a large number of widely dispersed users.

Current mobile communication services operate on a limited number of high frequency, low data rate, channels and have many more potential users than system capacity. Many systems, like cellular telephone, employ frequency reuse across an array of cells to increase capacity, with each cell having a short transmission range to increase frequency reuse and reduce interference. However, these lower power transmissions are more prone to frequency selective fading and signal blocking and require highly mobile users to frequently change channels as new cells are traversed. These systems are also prone to sudden communication loss when no channels are available in adjacent cells.

Cellular systems economically serve large metropolitan areas but leave many urban and most rural areas without any service or direct coverage at all. Messages for these areas are switched to conventional telephone or satellite carriers for long distance transfers to ground based systems which eliminates the flexibility desired. There are no direct satellite communication systems.

Direct communication, non-cellular, using traditional mobile radio transceivers also required constant monitoring of a variety of frequencies all of which are crowded with existing traffic. These services, like cellular telephone, are subject to frequent system overload and signal degradation from several interference sources which makes them incapable of handling a large volume of traffic. These transceivers also have a low range imposed by the need to prevent interference with other communication systems.

Communication systems based on Earth orbital relay satellites have been proposed as a new approach to solve many communication problems, especially coverage of geographically diverse, low user density or rural areas. Several systems have been proposed or developed to operate through orbital relay satellites and central communication stations. Examples of such systems are found in U.S. Pat. Nos. 4,291,409 and 4,455,651.

However, the high gain, low interference requirements imposed on such systems, especially in regard to adjacent Earth orbit relay satellites or concurrent satellite users, requires the use of large, narrow-beam, receiver antennas on the order of 4 feet or more in diameter, which eliminates mobile applications. In addition, these satellite systems are limited to low data transfer rates which severely limit the number of potential users and data transfer capacity. Otherwise, tracking and demodulating a high data rate satellite signal requires very high speed, complex, and expensive receivers that also consume substantial amounts of power for signal scanning and processing even when not receiving messages. Such equipment is impractical for a commercial message system.

What is needed is a communication system that allows continuous delivery of messages and related communication parameters or control information to a large number of users over a large geographical area. The system needs to provide a return link for message acknowledgment and responses. The system also needs to allow development of a complete private digital data network. The system needs to be cost effective; simple to operate, maintain, and install; and minimize antenna requirements. The system should also automatically adjust to handle many transfer errors associated with a mobile environment.

SUMMARY OF THE INVENTION

With the above problems of the art in mind it is a purpose of the present invention to provide a two-way message communication system capable of accommodating a large number of geographically diverse users.

An advantage of the present invention is that it provides a modulation scheme that provides performance comparable to a predetermined signal to interference ratio in any interference scenario encountered.

Another purpose of the invention is to use a novel modulation, coding, and multiplexing technique which allows an inexpensive two-way mobile terminal with a very small antenna suitable for use on a moving vehicle, to receive and transmit data reliably using a satellite repeater.

Yet another purpose of the invention is to provide a modulation and coding scheme that is implemented digitally, preferably as firmware in signal processing chips of the VLSI type and in microcomputers.

Another advantage of the present invention is that the communication signals can be more effectively screened from existing communication services.

Yet another advantage of the present invention is a high performance, cost effective, and flexible implementation.

Still another advantage is that the present invention provides a modulation and coding scheme that allows mass production of circuits and modules to be used for the remaining analog functions for the mobile terminals.

An object of the invention is to allow flexibility in data transfer rates so that receivers of differing transfer rates or capabilities are efficiently accommodated in a single system.

A further advantage of the system that results from the latter object is that more energy per bit can be used to compensate for unequal downlink power density across large geographical areas.

These and other purposes, objects, and advantages are realized in a message communication system for sending messages between central communication stations and one or more mobile terminals through Earth orbital relay stations comprising at least one central communication station having a first transceiver for transmitting a first communication signal from the central station to one or more mobile terminals and at least one mobile terminal having a second transceiver for receiving the first communication signal and demodulating it, and for transmitting at a predetermined duty cycle for the second transceiver, a second communication signal to at least one of the central communication stations. The preferred predetermined duty cycle over which the second communication signal is transmitted is about fifty percent of the second transceiver duty cycle. At the frequencies of interest the fifty percent duty cycle is on the order of 10-20 milliseconds in length.

In a preferred embodiment, the communication system first and second transceivers transmit and receive respectively Time Division Multiplexed communication signals which comprise N serial channels, with D data channels (D<N) used for transmission of message data and A address channels (where A=N−D) used for transmission of address information. The address information is in the form of terminal addresses where messages are designated to be sent.

The central communication stations employ a terminal assignment device which determines which terminals in the system a message is directed to and, accordingly, assigns a terminal address to the message; and a channel assignment device for assigning each message to at least one of the data channels for transmission. An address controller transfers a terminal address and an associated data channel assignment onto one of the address channels in response to input messages intended for each terminal. Alternatively, where a message is intended for several terminals, multiple addresses are designated or assigned to a message. Also, special group or all call addresses can be associated with each receiver to facilitate multiple receiver addressing with a minimum of address information when possible.

A message input control device is connected to the channel assignment device and receives digital messages and transfers them serially onto designated data channels in response to an assignment from the channel assignment device at a rate of one message per channel at a time. The input message data is nominally transferred at a rate on the order of at least 5,000 bits per second.

In a preferred embodiment the communication system applies Golay [24,12] block coding to the digital messages prior to transmission and applies a corresponding Golay [24,12] block decoding process to resulting symbol data when received. The Golay coding generates digital symbol data at a rate on the order of 10,000 bits a second. In addition, a checksum computation is performed on input digital messages with a series of bits being added to the end of the message for checksum verification by each receiver.

In further aspects of the invention, the operating frequency of the TDM communication signal is frequency hopped at differing rates between the forward and return links over a preselected number of frequencies to decrease the power density of communication signals.

A unique triangular waveform is used to modulate the RF carrier center frequency with a 2 MHz peak to peak amplitude and a period of 30.24 milliseconds. This causes a triangle wave power dispersal so that the forward link has the same interference characteristics as a single video carrier saturating the transponder so that no unacceptable interference is generated for satellites adjacent to or within 2° from the satellite.

The central communication station uses an input or conversion element to convert incoming message information from digital or analog sources into digital messages at a predetermined transfer rate on the order of 5,000 bits a second. The digital messages are then used to modulate a carrier to form the desired communication signal. The transmitter is connected to at least one narrow-beam antenna which directs communication signals to a preselected relay satellite.

The communication system of the present invention uses mobile terminals having small, portable, directable, narrowbeam antennas connected to a demultiplexer and other means for detecting, demodulating, and decoding the TDM communication signal so as to receive message data. The mobile terminals take advantage of the alternating duty cycle for transmission and reception to monitor the parameters of received signals and use changes as a guide to alter return link signal characteristics. In addition, the transceivers employ a single set of local oscillators for both transmit and receive functions.

BRIEF DESCRIPTION OF THE DRAWINGS

The novel features of the present invention may be better understood from the accompanying description when taken in conjunction with the accompanying drawings in which.

DETAILED DESCRIPTION OF A PREFERRED EMBODIMENT

The present invention provides a method and apparatus for transferring messages between one or more remote, mobile terminals and a series of one or more central communication stations or Hubs. The communication system provides this information transfer for a large number of users by using a Time Division Multiplexed (TDM) communication signal having message transfer channels and receiver address channels which are used in an alternating half duplex mode. That is, forward link and return link transmissions or reception for the central communications stations as well as mobile terminals alternate between a send and receive mode on a predetermined periodic basis to allow use of common elements in the up and down conversion chains as well as in the IF elements to minimize complexity and costs. At the same time, this alternating communication scheme allows TDM mode tracking and error correction which improves communications.

Figure 1:
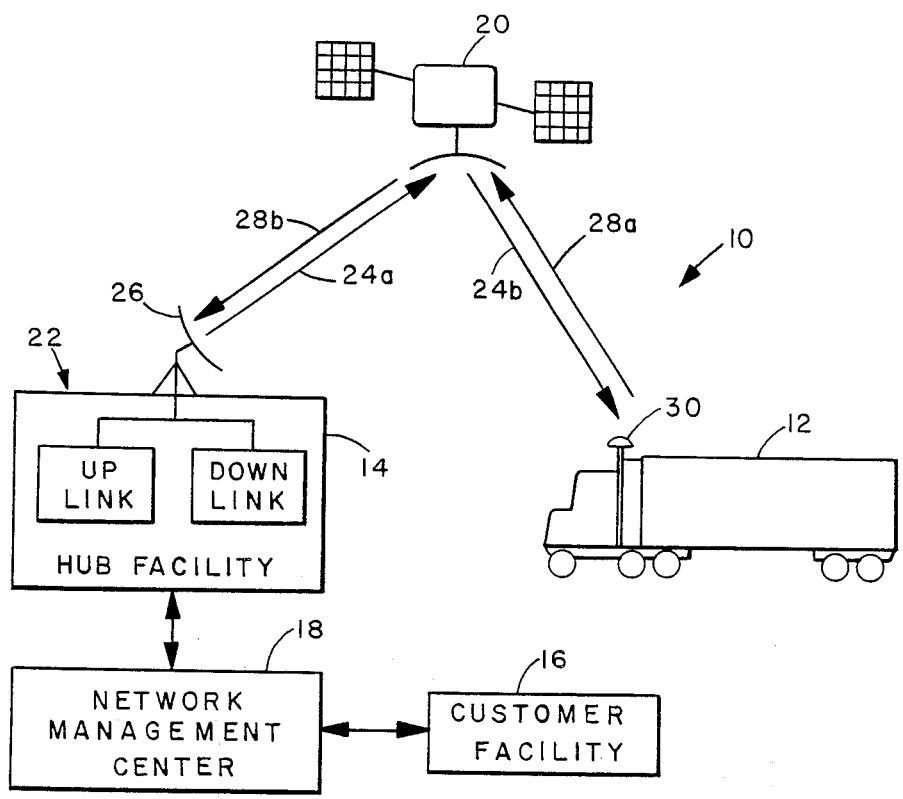
FIG. 1 illustrates an overall diagram of a communication system operating according to the principles of the present invention.

An overview of a communication system operating according to the principles of the present invention is illustrated in FIG. 1. In FIG. 1, a communication system 10 is illustrated having a mobile terminal (not shown) mounted in a vehicle such as a truck 12. The truck 12 represents any of a variety of vehicles whose occupants desire to obtain occasional or updated information, status reports, or messages from a central communication source. As previously discussed, truck drivers or various drayage personnel often have a need for ready access to messages for more efficient operation.

It is also very desirable to have a mobile system user be able to communicate at least some form of limited message or acknowledgment to the central control station in response to received messages. A reply message may prevent the need for further communications or may indicate a need for an additional instruction or updated message from new information provided by a vehicle driver. At the same time, by providing for a return link of communication, even if limited in content, it is possible to incorporate other features into the communication link such as simple message acknowledgment to provide verification of message receipt by the terminal whether or not the driver operates on the information. Other automatic responses may also be configured into the operation of the transceiver such as location and vehicle status.

The return link allows a driver to enter messages such as a verification of time and delivery information, or a report on current position or other status information.

A message is transmitted to the truck 12 from a central transmission facility or terminal 14 referred to as a Hub facility. The central terminal or Hub 14 can be placed at a location such as a trucking terminal or central dispatch office allowing lower cite costs and local, direct, access to transmission equipment for maintenance and system upgrade.

Alternatively, the Hub 14 is located in a remote location more ideally suited for low interference ground-to-satellite transmission or reception. In this case, one or more system user facilities in the form of central dispatch offices, message centers, or communication offices 16 are tied through a telephonic, optical, satellite, or other dedicated communication link to the Hub 14. In addition, for large numbers of remote customer message centers, a message or network management center 18 can be employed to more efficiently control the priority, access, accounting, and transfer characteristics of message data.

The Hub 14 or management center 18 can be interfaced to existing communication systems using well known interface equipment such as high speed modems or codecs which feed message signals into the communication system 10. High speed data management computers can also be used to determine message priorities, authorization, length, type, accounting details, and otherwise control access to the communication system 10.

The Hub 14 employs an Extremely High Frequency (EHF) transceiver to establish forward and return links or up and down link communication paths with a geosynchronous Earth orbiting relay or repeater satellite 20. These links are maintained at one or more of a number of preselected frequencies or frequency ranges. A typical satellite system employs a series of repeater transponders for transmitting 12 GHz frequency signals for TV or radio transmissions to ground stations.

The preferred embodiment of the communication system 10 employs uplink and downlink carrier frequencies in the EHF Ku band to allow access through the transponders on existing or new communication satellites already launched or planned. The communication system 10 can take advantage of unused or excess satellite capacity at these frequencies and does not require the launching of its own, new, dedicated satellites. Therefore, the benefits of the present invention are immediately available without additional expensive satellite technology. However, the communication system 10 can also be implemented at other frequencies dependent upon available satellite transponders and can provide improved communication through some ground based repeaters.

The Hub's transmission signal is transferred through a diplexer 22 to an antenna 26. The antenna 26 comprises a very small aperture antenna for directing the communication signal 24 to a single orbiting satellite.

A forward link communication signal, designated 24a, is transmitted through the antenna 26 to the communications satellite 20 at the preselected uplink carrier frequency. The communication signal 24a is received by the repeater satellite 20 where it may be translated to a second frequency for the downlink transmission 24b. Those skilled in the art of communications understand the apparatus needed to perform this reception and conversion function which are known in the art. Using different frequencies for the uplink and downlink communication signals reduces interference.

Current satellites typically support a number of independent communication channels with about 48 Mhz of bandwidth. These satellites use polarization isolation to obtain frequency reuse, with one set of channels operating at one polarization (horizontal or vertical) and another set operating at the same frequency with an offset of $\frac{1}{2}$ channel and operating with a 90° polarization shift. This 90° polarization shift is normally applied between forward link and return link communications for one communication channel with one transponder used for the uplink and one for the downlink.

The transmitted forward downlink signal 24b is received by a mobile transceiver 70 (FIG. 4) through a small, generally directional antenna 30. The antenna 30 is constructed to have about 15 dB of gain and to be directional within a 40°-50° elevation beamwidth and 6-10° azimuthal or orbital arc beamwidth. The antenna 30 is mounted so that it is capable of being continuously rotated over a 360 degree arc and has an unobstructed field of view for the satellite 20. The antenna is connected to an antenna pointing and tracking control system 74 (FIG. 4) for tracking the satellite 20 as the vehicle 12 changes position relative to the satellite. An exemplary antenna rotation mechanism is found in co-pending U.S. patent application Ser. No. 07/145,790 now U.S. Pat. No. 4,876,554 issued Oct. 24, 1989.

Messages, or message data are transferred into the Hub 14, or network management center 18, where they are converted into digital message signals which are transferred at a rate on the order of 5,000 bits per second. Those skilled in the art will readily understand that the teachings of the present invention apply to higher, or lower, data transfer rates when circuitry operating at the appropriate speed is employed. Messages can be received directly as digital data at various bit rates and accumulated or stored for translation to the desired system transfer rate. Alternately, messages are received as audio message signals that are keyed in by system operators to form the desired message signals. In addition, some message information is generated internally or directly by the network management center 18 for communicating system type data, such as time, terminal assignments, rates, etc.

Each message signal can be subjected to a variety of coding, encryption, or error detection and correction schemes prior to transmission. Where desired, individual terminals can employ unique codes or ciphers to provide secure message delivery capabilities. However, to reduce transmission errors and provide for error correction for all messages transmitted by the communication system 10, at least two encoding steps are implemented for all digital messages or message data.

One step comprises applying a system 10 checksum algorithm to the digital message data. In the preferred embodiment, the checksum algorithm employs on the order of 30 bits of information to indicate the values resulting from checksum computations which are used to detect transfer errors. An exemplary checksum formula for use in the communication system 10 is the computation of the polynomial: $X^{30}+X^{29}+X^3+X^2+X+1$. When calculating this checksum the address field (see below) of a message is ignored so that channel addresses do not alter checksum values.

A second step comprises encoding all data, message, instructions, or addresses, using a Golay [24,12] block code to encode every 12 bit block of information, including checksum, type and recipient information, into 24 binary symbols for transmission. These 24 bits are then transferred at the desired system transfer rate. Using the Golay [24,12] block coding scheme means that 5,000 bits of message data forms a 10,000 bit encoded symbol stream for transmission. Therefore, the system 10 transmission signal rate is about 10,000 binary symbols or bits per second to accommodate the 5,000 bit per second input data rate. On the reception end, the code symbols or blocks are decoded to regenerate the 12 bit blocks of information. As known in the art, the operation of a Golay [24,12] or similar code acts to minimize transmission error by decreasing the impact of single bit errors on a data stream through spreading the data out over multi-bit patterns. Each bit error affects only a fraction of a bit in the message which is effectively compensated for by the error correction schemes used until very high error rates occur.

The encoded message symbols are used to modulate a frequency generator or source such as a Direct Digital Synthesizer which creates an FM modulated carrier, at a preselected frequency which is up-converted to the desired EHF band for transmission to the satellite 20. The encoded symbols can be used to drive a BPSK modulator which is coupled to the carrier wave source for the communication system 10.

In the preferred embodiment, each symbol is shifted in phase from the previous symbol, either −90° to indicate a 0 or +90° to specify a 1. This is referred to as Differential Advance Retard Keying and improves acquisition by the terminal because every symbol contains a phase transition.

To decrease interference and accommodate a large number of terminals at potentially different burst rates, a Time Division Multiplexed (TDM) transmission scheme is used. The TDM approach divides the total transmitted (or received) spectrum into temporal increments or frames of predetermined length. Messages or message signals transmitted in or by the communications system 10 are allocated portions of this time controlled sequence known as channels, and no other signal uses the system at exactly the same time. The allocated portions or channels are very small, temporally, and their interleaving across successive frames very large so that communication appears simultaneous to all terminals. Methods and apparatus for generating, transmitting, and controlling TDM signals are well known in the communication art and can be accomplished using a variety of signal multiplexing and control devices.

Each frame consists of a number of channels which represent substantially identical, sub-frame length periods during which symbols are transferred. This means that messages or message signals are transferred a few bits at a time during each successive frame until the message is completed. The preferred embodiment divides each frame into 25 sub-frames or channels. However, those skilled in the art will readily understand that the number of channels depends on the transmitting speed of the communication system 10, number of users to be accommodated, and frequency hopping schemes as described below.

In using the TDM approach, information is generally sent over the communication signals 24a, 24b in discrete packets. The communication system can accommodate packets of differing lengths between 4 to 256 characters each, depending on the type, burst rate, or size of messages being transferred. In addition, the messages, preformatted or free-form, are generally limited to 2000 characters in length to facilitate transfer speed and high message capacity.

Each packet is generally segmented into fields of information such as the type of message, typically a 6 bit entry to distinguish between possible alternative system formats, the length of the message, to allow proper tracking, the body of the message, and the checksum bits. There is also an address field of 24 bits associated with each message as discussed further below. Those skilled in the art will readily understand that some "zero packing" will be used from time to time to assure a uniform frame size regardless of overlapping message lengths, varying packet sizes and transmission rates, or empty channels. However, unused channels generally will have random data transmitted to improve tracking and acquisition of channels by transceivers.

To assure that each transceiver is tracking and demodulating a designated channel, a series of codes or code masks can be used with the data to detect tracking errors. That is, short bit patterns can be added to the data transferred by each channel to allow automatic differentiation from data in adjacent channels. Once a transceiver commences demodulating one channel it records the code mask for that channel. The mask is used to decode or demodulate all data received until the end of the message. If the transceiver erroneously uses data from adjacent channels, the code mask will prevent incorporation into the message.

In order to further reduce interference by increasing isolation and, thereby, increase the system 10 message capacity, Frequency Hopping (FH) of the carrier frequency can be used. An FH technique spreads the power density of the signal 24 over the entire transponder 48 MHz bandwidth, reducing downlink power density which minimizes interference with other communication services and provides processing gain which the transceivers use in rejecting the interference of other services. The basic techniques of FH-TDM transmissions are known in the communication art and also provide a vehicle for spreading a signal out over a given bandwidth so that transmission errors caused by frequency selective fading or other aberrations only affect a small portion of the signal. At the same time, frequency hopping according to a unique pattern allows some degree of security for some system 10 users.

In the preferred embodiment, the forward link FH scheme comprises dividing the appropriate forward link (downlink) transponder bandwidth (11.7–12.2 Ghz) into 240 frequencies located approximately 2.5 MHz apart. The hopping rate for the frequencies of interest is on the order of 200 frequencies per second covering the 240 discrete hopping frequencies before recycling. This means that the dwell time for each frequency is about 5 milliseconds. If each TDM frame is transmitted at a new frequency then each frame is about 5 milliseconds long and the size of each channel is roughly 0.20 milliseconds in length.

The frequency hop pattern can comprise a simple linear progression from high to low or vice versa, but a more complex pattern based on a pseudo-randomly generated frequency selection sequence is preferred. However, those skilled in the art will also recognize that a TDM signal without frequency hopping will benefit greatly from the method and apparatus of the present invention.

Returning to the desired transmission rate of 10,000 symbols per second or 1 symbol every 0.10 millisecond, it is seen that each frame period allows 2 symbols to be transmitted per channel. This would imply a transmission rate of forty-eight (48) code symbols every frame. However, to improve reception, the preferred embodiment uses a fifty (50) symbol transmission rate for each frame with the first symbol period employed for settling time to assure that the transceiver has locked onto, and the transmitter is accurately within, the selected frequency and not offset due to the changing characteristics of the frequency source.

The second symbol is used as a phase reference for the third symbol in the stream of fifty symbols, with the third symbol being the first message symbol. Each successive symbol is used as a phase reference for the next. This relies on a differentially coherent demodulation scheme as opposed to an absolute phase reference since absolute reference approaches are more complicated and extremely difficult to achieve in a mobile communication system.

The code blocks or symbols are divided into alternating groups or sequences. That is, every other code block is selected and placed in one 24 symbol group for transmission. This separates every other code symbol from its adjacent symbol which spreads code symbols that are close together in code to be far apart in time. This interleaves the code blocks to provide a means of minimizing signal errors generated as a burst of errors in a sequence by spreading the message signal over a wide signal bandwidth.

The FH-TDM type communication signal 24a is transmitted by the Hub 14 through the repeater satellite 20 (where it becomes signal 24b) to all of the terminals within a given geographical zone or region serviced by the satellite. This zone can be as large as an entire country, or as narrow as a small state depending on the application. However, regardless of the zone covered by the satellite, each terminal in that zone normally would have to detect, monitor, and demodulate the signal 24b in order to receive messages. If the messages are simply applied across all of the channels, then each transceiver has to continuously track, demodulate, and decode the entire wide bandwidth signal to assure reception of a relevant message. This would be required because every message header or lead-in, in every channel, would have to be scanned by each transceiver to verify which terminal is designated to receive the message. For large numbers of users this requires very high speed, complex, demodulation circuitry to accomplish. Since speed and complexity increase system cost and decrease reliability, this is undesirable.

In the present invention, terminal selection is accomplished using a new terminal or transceiver addressing technique for TDM communication signals which comprises a two part addressing scheme. This technique is explained in greater detail in copending U.S. patent application Ser. No. 07/144,905 also assigned to the assignee of the present invention.

In this technique, each terminal is assigned a unique system address which is known to all Hub 14 transmitters or management centers 18 used by the communication system 10. The terminal address establishes an individual identity for each terminal in the system. This address is generally set at the time of terminal manufacture or installation and can be made unalterable by a transceiver user or made dynamically changeable by the system 10 depending upon the system requirements or costs. In the preferred embodiment, the transceiver addresses are designated or determined by a 19 bit address term making approximately 524,288 ($2^{19}$) terminal addresses available which allows a very large number of users for the message communication system 10.

In addition to the "individual" address, terminals can also respond to specialized "system" addresses such as a "group" address (if applicable), an "all-call" address, or other "conditional" addresses. By providing these alternate addresses, to which a terminal, can respond, it is possible to very efficiently transfer single messages to an entire system or a group of terminals without sending the same message to every designated transceiver over a longer transmission period. This also provides for the transmission of system type information such as time of day, service changes, etc., to all terminals on a periodic basis, by interleaving these types of messages into otherwise unused channel capacity.

With terminal addresses defined, the communication channels in the FH-TDM communication signals 24a and 24b are divided into an address portion of A channels and a data or message portion of D=N-A channels. In the preferred embodiment A is 4 and D is 21. However, other values for the total number of channels and address channels can be used depending upon specific system requirements.

The A address channels are used to transmit address information and designations for those terminals whose messages are being transmitted by the Hub 14. The D data channels are used to transmit the messages for the designated terminals. The transmission of each message address precedes the transmission of that message by a predetermined period of time to allow a terminal to adjust its tracking circuitry and synchronize with the appropriate channel before the arrival of the message.

The address channels are typically designated as system channels 1, 2, 3, . . . etc. However, these channels can be separated by data channels where channel tracking either permits or desires this spacing for transceiver demodulation. In addition, the number of channels can be dynamically adjusted by the system 10 to accommodate several problem situations. One problem arises when there are a great number of messages, saturating the address channels but the messages are short, thus leaving excess data channel capacity. In this situation, a data channel could be reassigned to be an address channel. The opposite problem occurs when there are an average number of messages but they are all maximum length. The system 10 may find it advantageous to use one of the address channels for data to decrease the number of messages being backlogged.

This addressing scheme means that address information only needs to be demodulated at a fraction of the communication signal rate allowing each transceiver to monitor the communication signal 24b at this lower rate until it detects its address. When a terminal detects its address, accompanied by a channel assignment, the transceiver switches to the appropriate channel and begins demodulating and receiving the message. Therefore, it will be apparent to those skilled in the art that transceivers are not demodulating nor decoding the entire, or even a majority of the communication signals 28 transmitted by the communication system 10. This allows a less complex and slower speed reception circuit which reduces power and cost while increasing reliability and ease of construction. Where desired, each transceiver can be assigned a specific address channel to monitor, dynamically or fixed, which further reduces processing to a 1/N rate for both addressing and message demodulation.

Figure 2:
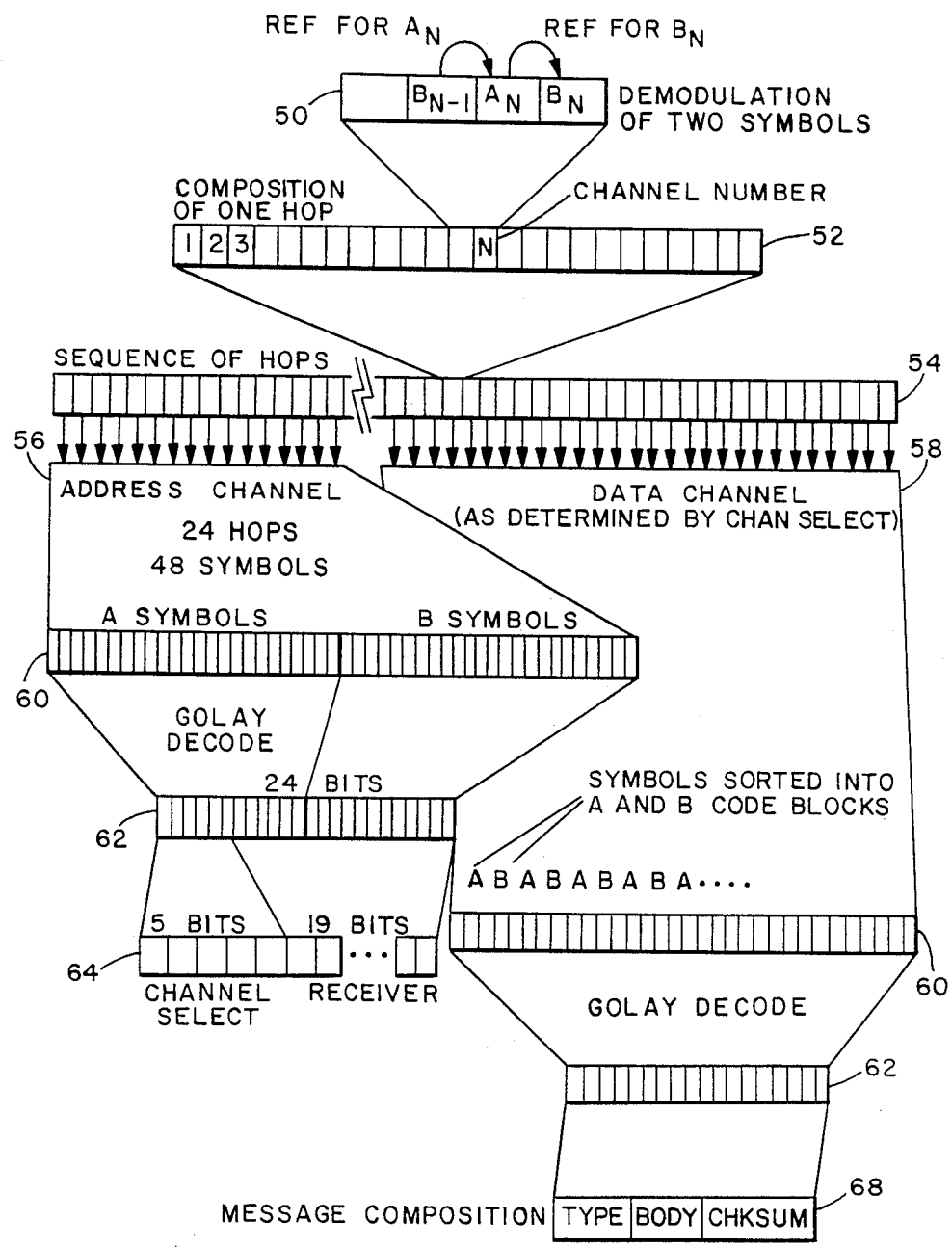
FIG. 2 illustrates an overview of the message encoding/decoding and channel multiplexing of communication signals used in the system of FIG. 1.

Reception and decoding of communication signals is illustrated in further detail in FIG. 2. In FIG. 2, an incoming communication signal comprising interleaved code symbols 50 is received by each transceiver on a series of signal channels 52 which are frequency hopped in a sequence of hops 54. The messages are received on the data channels 58 while address information is received on the address channels 56.

The digital code symbols comprise the code block symbols described above and are received at a rate of two symbols per channel per frequency hop. There are two extra symbols received during each hop with the first disregarded or lost due to settling of the transceiver and the second being used to obtain the phase required to track the third symbol. Therefore, there forty-eight information symbols per frame in each hop. With 2 symbols per channel, 48 symbols are received for each channel after 24 hops.

After 48 symbols are accumulated they are sorted into a first and second series of symbols shown in FIG. 2 as "A" symbols and "B" symbols with each group having 24 symbols. Both message and address code symbols are sorted into 24 symbol code blocks 60 using a sorting step and apparatus. This process removes the interleaving previously impressed on the code symbols as they were transmitted. As can be readily understood by those skilled in the art, those symbols that were close in code are transmitted far apart in time which provides isolation from errors as previously discussed.

Every block of 24 symbols, "A" or "B" is decoded into successive 12 bit blocks 62 using a Golay [24,12] decoder. The Golay [24,12] decoding step yields 12 bit blocks of transmitted data. This data will be generated or received at about 5,000 bits per second as originally transmitted (before encoding). The 12 bit blocks of information now comprise a series of address assignments or messages depending on which channel they were received on.

The output of the address channels 56 comprises 24 bit length information sequences 64 which use 19 bits to specify a transceiver address within the communication system 10 and 5 bits to indicate a channel selection for receiving a message directed to that transceiver. Each message has an address 24 bit segment associated with it which is segregated from the message and transferred over the address channels to flag an appropriate transceiver.

The output of the message or data channels 58 comprises a series of successive 12 bit blocks 68 which comprise a header that indicates the type of message, including its length, a main body of the message and a series of checksum bits for error detection. The length of the incoming message is important so that the transceiver can properly track the entire message or provide an indication of error if the entire message is not received.

As previously discussed, it is clearly understood that address information for a transceiver is sent before the message is transmitted on a data channel. The amount of "lead time" for transmitting address information depends on the channel switching speed of the transceivers as would be known by those skilled in the art. The address must be provided prior to the message by a time period equal to this switching time plus some settling time for the transceiver to properly and accurately track the designated channel.

Figure 3:
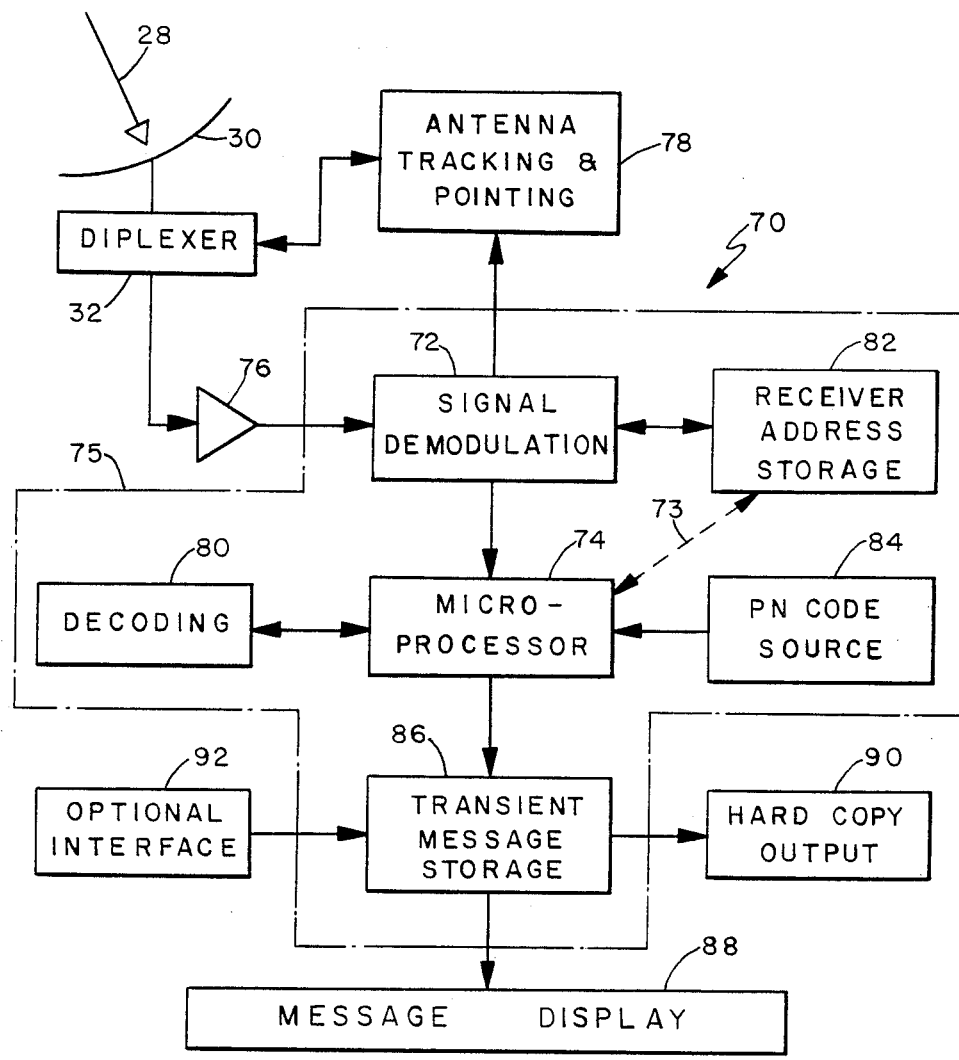
FIG. 3 illustrates a schematic representation of exemplary circuit functions employed in a transceiver for the system of FIG. 1.

An exemplary transceiver for receiving the communication signals and providing a message output is illustrated in schematic form in FIG. 3. In FIG. 3, a transceiver 70 is shown for receiving and demodulating communication signals 24b from the Hub 14 and satellite 20. The transceiver 70 is connected to the antenna 30 through a diplexer 32 for receiving the satellite downlink signal 24b which is transferred into a demodulator 72 for demodulation into an encoded symbol stream (digital message).

The demodulator 72 employs elements known in the art for down-converting the received communication signal 24b to a lower IF frequency level and then symbol frequency level (10K symbol bits per second). A local oscillator and other reference signal sources would be provided for mixing with the communication signal 24b along with one or more bandpass filters.

Once the signal 24b is demodulated and decoded it is transferred to memory storage for accumulation of a message and other processing steps. The demodulator 72 transfer rate is synchronized with the modulator used in the Hub 14 or the satellite 20.

Synchronization for the transceiver 70 is accomplished by tracking and synchronizing with the frequency hopping pattern of the communication signals. Once a transceiver has synchronized with the frequency hopping of the TDM signal frames then the internal frame timing is automatically detected as well.

The mobile transceiver or terminal 70 incorporates a low cost microprocessor or similar controller 74 for implementing signal processing, acquisition, and demodulation functions. A low noise amplifier 76 and the conventional down-conversion chain of the demodulator 72, provide a signal to the microprocessor for signal acquisition, tracking and demodulation. Information from the demodulator 72 or the microprocessor 74 is provided to an antenna tracking and pointing controller 78.

The antenna 30 is generally swept through a series of 360° arcs by the controller 78, until a signal is detected from the satellite 20, in the receiver's frequency range, above a predetermined threshold. At this juncture one or more tracking and signal processing algorithms are used to determine the direction of highest signal strength and the antenna tracks that direction relative to receiver or vehicle 12 position or movement.

Figure 4:
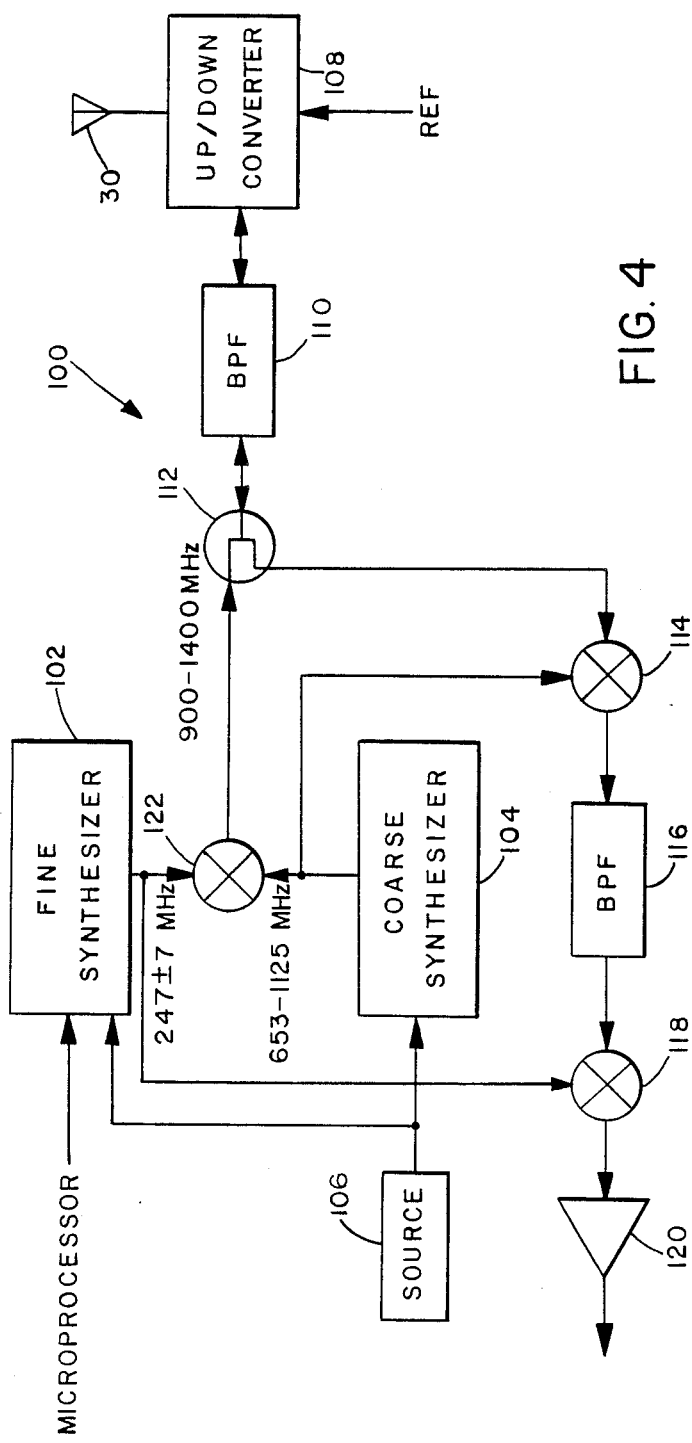
FIG. 4 illustrates a schematic representation of exemplary demodulator/modulator circuit functions employed in a transceiver for the system of FIG. 1.

Many of the individual functions performed by or under control of the microprocessor 72 are illustrated as separate elements in FIG. 4 for purposes of clarity. However, those skilled in the art will readily appreciate that the functions surrounded by the dashed line 75 can be performed in a single miniaturized circuit by an integrated circuit microprocessor and related support chips. This allows implementation in a high reliability, low cost, low power consumption circuit or using VLSI technology.

A receiver address storage element 82 is connected to the demodulator 72 for storing the address assigned to the receiver 70 and used to determine the presence of a message from the satellite 20 or Hub 14. The address storage element 82 typically comprises a small ROM or similar memory device connected to the microprocessor 74 as indicated by the dashed line identified by the reference numeral 73. The address can be hardwired into the microprocessor structure itself such as in the case of scratch memory, or internal RAM although this may not be convenient or cost effective in many applications. In addition, the use of a separate memory element allows alteration by service personnel at a future time where needed.

It is also possible to store the receiver address on a portable storage element such as a magnetic strip or cartridge which can be read by a card reader (not shown) connected to the microprocessor 74. This would allow individual communications system 10 users to move between receivers which are permanently installed in a variety of vehicles and automatically receive messages without informing a central dispatcher of a new receiver location.

Once a receiver address matching that stored in the address storage 82 is detected, the channel designated by the corresponding address information is also received and registered by the receiver 70. The receiver 70 automatically switches to synchronize reception on that channel and begins demodulating a message signal.

If the antenna fails to track the communication signal 24b at any time during the reception of a message, or any type of signal failure or blockage occurs, one or more errors will be detected in signal demodulation and no message will be displayed. Such errors could include premature termination of the message before the length, time, specified in the message header or the failure of the checksum verification process.

The demodulated communication signal is transferred to a decoder 80 where Golay decoding occurs. At the same time, a pseudo-random code source or other related code storage element 84 provides any necessary code sequences required to further decode a received message.

The decoded message bits may be temporarily stored in a memory element 86 before visually being displayed by a display element 88. An exemplary display element comprises a two to four row, twenty to eighty character wide display unit capable of running from relatively low current. The individual segments of the display can comprise LED, LCD, electroluminescent, or discharge element type character displays. Consideration must be given to the brightness generally required in a vehicle environment to prevent undue distraction of a drivers attention.

The display unit 88 should be as compact and lightweight as possible so that it can be mounted in an easily viewed location. In addition, the display can incorporate a message ready indicator or message error indicator so that the receiver users know that a message was sent.

Alternatively, the message can be interfaced to other processing elements, such as a portable computer, through an interface device or connector 92 or printed out by a hard copy device 90, such as a small thermal printer.

What has been described to this point is the forward link which provides the advantage of delivering messages to a large number of users in almost any location, metropolitan or rural, throughout the country with high reliability and relatively low cost.

However, the communication system 10 offers the added advantage of a return communication link so that short responses can be made to received messages where desired.

For the return link each transceiver or mobile terminal uses a low power signal on the order of 1 Watt and an antenna gain of about 19 dBi for a transmit power of 19 dBW. The return link is transmitted at a higher frequency than the forward link to decrease interference. The frequency chosen is in the typical satellite Ku band transponder range between 14–14.5 GHz. However, as before other frequencies can be employed for this return link.

The return link communications signal 28a uses a frequency hopped waveform similar to the forward link but takes advantage of typically slower data transfer rates occurring from a mobile communications terminal. That is, return messages or data are not going to be entered into a local terminal at high speeds where a terminal operator is manually responding to a message. Where acknowledge and other prestored signals are used they are adjusted to a slower bit rate to comport with the slower manual entry mode.

Since data is typically provided on the return link at slower rates on the order of 100–140 bps maximum, and more typically 22–48 bps, the frequency hop rate needs to be decreased on the return link in order to allow sufficient dwell time for each channel to transmit the data. To transfer Golay [24,12] encoded data this becomes 280 symbols per second. Therefore, the forward link rate of 200 frequencies per second should be reduced to about 60 frequencies per second.

Messages being input to the transceiver 70 are subjected to a rate $\frac{1}{3}$, k=9 forward error encoding convolutional code.

The small, portable and directable antenna 30 typically has a beamwidth on the order of 6-10°, which is wide enough to encounter more than one satellite. Therefore, steps are taken to provide a return link waveform that does not interfere with existing services on adjacent satellites.

A direct sequence spread spectrum coding function is applied to the return transmission to spread the signal out over the transponder bandwidth and make the communication signal 28a appear as relative noise to adjacent services. For this application a short direct sequence pseudo-random code is used. This code is typically applied to a direct digital synthesizer or similar modulated frequency driver.

In the alternative, or in addition, either the forward or return link communication signals are modified by modulation with a special modulation waveform that disguises the signal to other services.

All satellite communication services are currently configured to detect and prevent interference by standard video data or signals since a majority of satellite usage is for television and video type broadcast transfers. Therefore, all satellite services, video or otherwise, must be able to detect and isolate video signals which are transmitted employing a triangular wave form of modulation. In the present invention, this general waveform is mimicked so that other systems perceive communication signals 24 or 28 as video signals which are ignored. This is accomplished by modulating the RF carrier center frequency for the Hubs 14 or transceivers 70 with a triangular waveform having a 2 MHz peak to peak amplitude and a period of 30.24 milliseconds. This causes a triangle wave power dispersal so that the forward link has the same interference characteristics as a single video carrier saturating the transponder so that no unacceptable interference is generated for satellites adjacent to or within 2° from the satellite 20. The triangular modulation can be implemented by altering the characteristics of a DDS output which will accurately track a triangle wave and yet transfer more information than a true video signal. To facilitate frequency coordination, the center frequency is fully synthesized at the Hub and mobile terminals and can be placed anywhere within the transponder, after informing the transceivers of the new center frequency.

While interference by the transceiver 70 with other services has been discussed, this is not the only restriction on optimum operation. The transceivers 70 must also be able to quickly and reliably acquire the Hub 14 or satellite 20 transmissions and continue to track them while moving. In addition to interference from other systems, the transceivers 70 face interference and loss of signal due to a variety of inherent impediments for mobile communications, including Doppler effects, frequency fading, etc.

The present invention counters many of these problems by assuming that there may be significant changes in the transmission capability of the communication system 10 on a very short time scale, interpreting any change to altered environmental conditions, and adjusting for such changes. Each transceiver 10 monitors the quality of or results of communication with the Hub 14 and periodically adjusts operational parameters to maintain or improve communication links accordingly.

This is implemented in the present invention by operating all transceivers in an alternating half-duplex transmission/receive scheme. Transceivers are operated in a half-duplex mode with transmissions done at a 50 percent duty cycle to allow for continued antenna tracking and error correction based on received downlink signals.

If at any time the downlink signal is lost then transmission also terminates to assure that unacceptable interference is not generated.

If the signal is lost, as previously stated, any partial message is deleted from memory and not present for display. However, another key criteria is that if there is no downlink then the transceiver uses this information to recognize that there is no uplink. Actually an uplink may be possible and the error could be in the receiver only. However, the system assumes that without a downlink the uplink information is either not being received or is no longer needed. In any case, the transmitter function is terminated if the receiver link is terminated for any reason.

This provides a very good safety feature for commercial applications of the transceiver 70. If the reception were to be interrupted for any reason, including a person interfering with reception by stepping in front of or otherwise traversing the antenna path, then within a fraction of a second all transmissions from the antenna are terminated. Therefore, no radiation damage of any significance nor hazardous exposure can ever occur for the transceiver of the present invention making it ideal for broad distribution in a commercial (mobile) communication system.

The transceiver 70 is normally configured to be in a receive mode wherein it monitors an assumed satellite position or general horizon looking for a signal for incoming communications signals. This initial signal acquisition occupies the full duty cycle of the transceiver. Once a signal is detected, tracked, and acquired, the transceiver operates on the 50 percent duty cycle. Each half cycle is a very short period of time on the order of 15 milliseconds.

After signal acquisition, the transceiver 70 synchronizes with the forward link FH pattern and rate and switches to the correct channel frequency for receiving either channel address or a message. Then, every 15 milliseconds the transceiver 70 switches to the return link FH rate and pattern for a period of about 15 milliseconds. However, the transceiver does not transmit until or unless requested to do so by the Hub 14 or management center 18. This assures that the Hub is prepared to receive the message and that there are no higher priority tasks in progress, including receipt of high priority emergency messages or alternate system 10 operating data. Also, polling controls the number and frequency of receivers to regulate interference at all times.

The transceiver 70 then returns to the receive mode and continues to demodulate and decode messages, if any, and so forth.

This alteration between send and receive on a periodic and short term basis provides the transceiver 70 with several operational advantages.

First, the transceiver monitors the power level and characteristics of received signals every 15 milliseconds and detects substantial changes. The hub and mobile transceiver must agree well enough in terms of frequency to allow the transceiver to acquire and track the forward link signal. The transceiver will search +/−18 KHz about the nominal specified frequency.

There are several possible sources of error. The hub 14, satellite 20, management center 18, and transceiver 70 all have internal reference oscillators for establishing transmission frequencies employed. Each of these references can drift and cause frequency errors. The orbital relay satellites can cause small frequency errors during translation of the communication signals between up and down link frequencies. The transceiver 70 reference oscillator may drift and is subject to temperature change induced variations.

In the communication system 10 the Hub employs a Forward Link Processor (FLP) which adjusts transmission frequencies to correct for some of the possible errors listed above. First, however, the error in the Hub reference oscillator is assumed to be too small to measure. This is generally justified due to the fixed nature of the Hub facility and the heavily controlled environment and periodic maintenance such a facility undergoes.

Satellite translation error is measured and corrected by using a reference receiver at the Hub and using a testing or control pattern of information between the Hub and the reference receiver through the satellite. The FLP sends commands to the satellite to adjust the translation frequencies to match what the Hub transmits. Any residual error, say from the control signals, is also assumed to be too minimal to have an impact on communication quality.

The transceiver oscillator drift is corrected by the transceiver according to a long term software program that assumes certain drift characteristics for the transceiver oscillator. Therefore, temperature drift is the largest reference error and it is corrected by comparison to the other references using the communication signals.

With the reference sources adjusted, the transceiver assumes initial frequency variations in signals are due to initial frequency tracking and synchronization misalignment. However, once a signal is acquired the receiver assumes that all variations are due to receiver positioning relative to the relay satellite or similar non-internal frequency problems. Therefore, the receiver assumes that antenna pointing and tracking must be adjusted when the overall power level of a signal decreases (as when a corner is turned) and that variations in frequency tracking are caused by Doppler effects which must be countered. That is, variations in received frequency are assumed to be caused by changing characteristics of the communication link itself and not the error sources discussed above, which have been corrected. This means that errors in tracking frequency are attributed to Doppler shifts from vehicle travel and the frequency of both the receive and transmit functions of the transceiver are adjusted to accommodate this shift. Since the signal is constantly monitored on a short term basis, the present invention provides improved tracking and Doppler compensation.

Another advantage of the alternating half-duplex technique is that the transceiver does not need a full compliment of circuitry to handle both functions. That is, several circuit elements can be shared between the two functions since they are separated in time. Elements such as the antenna, antenna and related circuit feed cables, certain bandpass filters, and the transceiver local oscillators, can be shared between the transmit and receive functions if configured appropriately.

In the present invention the transmit and receive frequencies are chosen to be within the preferred Ku or 11.5 to 14 GHz bandwidth as disclosed above. However, to achieve these extra high frequencies, one or more up-conversion stages or IF mixing stages are required in the transceiver 70 circuitry. It has been found that a series of desirable uplink and downlink or forward and return link frequencies within the specified bandwidth and frequency hop scheme can be chosen so that they are separated by a very narrow margin in the intermediate IF stages and a common tunable local oscillator can be employed for both the transmit and receive function.

The result is that fewer components are required which reduces cost, increases speed and reliability (switching speed) and very importantly, decreases power consumption and size of the transceiver.

A schematic diagram of a transceiver 70 analog modulation/demodulation section 100 operating according to the principles of the present invention is illustrated in FIG. 4. In FIG. 4, a modulator/demodulator 100 is shown having a Fine frequency synthesizer 102 and a Coarse frequency synthesizer 104.

The coarse frequency synthesizer or Local Oscillator (L.O.) 104 represents a source of high to extra high frequency signals which is generally tunable over a broad range of interest in large steps on the order of 2-5 MHz each. An exemplary coarse oscillator for use in the present invention is a Phase Locked Loop (PLL) type oscillator generating output signals at frequencies on the order of 652-1175 MHz. in steps of 2.5 MHz. (652.5, 655, 657.5, ...)

The fine frequency synthesizer or oscillator 102 provides a finely tunable source of frequency with very low noise and is tunable over a smaller frequency range and or in smaller discrete steps. The fine frequency synthesizer 102 can comprise one of several frequency sources that provide a high accuracy, high resolution output in the frequency range between 5 to 20 MHz with direct digital synthesizers being preferred. An exemplary circuit for an advanced digital synthesizer useful in the present invention is disclosed in U.S. patent application Ser. No. 07/145,789 filed Jan. 19, 1988 now U.S. Pat. No. 4,905,177, issued Feb. 27, 1990, and assigned to the same assignee as the present application.

In FIG. 4 a single reference frequency source 106 is shown for use with the PLL of the coarse synthesizer 104, the fine synthesizer 102, other elements in the modulator/demodulator 100 and other oscillator and processing stages for the transceiver 70. This provides a system wide, synchronized reference or clock source which improves signal to noise ratio and allows simplified system wide synchronization with other system where desired. An exemplary reference source 106 provides a reference signal at 10 MHz from a highly stable reference source such as a rubidium standard.

Communication signals received from the hub 14 are received on the antenna 30 and transferred through an up/down converter 108 and through a band pass filter 110 to a power splitter 112. The power splitter 112 exhibits a 3 db separation and is used to redirect received signals along a different internal processing path from the transmit signals and transfer them to a demodulation portion of the transceiver 70.

Incoming or received communication signals 24b are first mixed with the output of the coarse synthesizer 104 to down convert them to a lower IF frequency in the range of 250±7 MHz. This is accomplished using a signal mixer 114 which uses the communication signal as one input and the output of the coarse synthesizer 104 as a second input. The output of the mixer 114 is filtered by a band pass filter 116 to remove unwanted frequency components added to the down-converted communication signal by the mixer 114.

The output of the band pass filter 116 is transferred to a second mixer 118 which has the output of the fine synthesizer 102 as one input. The mixing of these two signals provides a final IF frequency signal in the 20±20 MHz range.

The output of the mixer 118 is transferred through a crystal filter 120 to the microprocessor 74 and subsequently decoded and displayed as a message for the transceiver 70.

When a transceiver 70 user has input a message through the display unit 88 or similar input means it is encoded and transferred into the modulator/demodulator 100 by modulating the input of the fine synthesizer 102. This is easily accomplished using direct digital synthesizer technology as understood by those skilled in the art. The output of the fine synthesizer 102 is applied to one input of a mixer 122 and the output of the coarse synthesizer 104 is applied to a second input of the mixer 122 to generate an intermediate IF frequency. This generates an output frequency from the mixer 122 on the order of 900-1400 MHz when the coarse synthesizer 104 generates a frequency on the order of 652-1175 MHz and the fine synthesizer 102 generates an output in the range of 247±7 MHz.

The resulting transmit carrier, complete with modulated message data, is transferred to the up/down converter 108 connected to the transceiver antenna 30. The bandpass filter 110 filters unwanted frequency components from the transmit communication signal as it is transferred through the splitter 112 to the up/down converter 108.

The bandpass filter 110 is generally a single section varacter tuned voltage controlled type filter which removes local oscillator or synthesizer frequencies and low frequency images and also allows tuning to other frequency bands for use in the forward link demodulation.

The communication signal is up converted by the converter 108 to the desired 11.7-12.2 GHz range by mixing with a 13.1 GHz reference. The up/down converter 108 can be configured as an output channel having a power amplifier connected to a diplexer for the antenna 30 with a mixer connected to a local oscillator providing the 13.1 GHz mixing reference frequency. On the return link the up/down converter 108 presents a second mixer connected to the 13.1 GHz local oscillator for down converting received communication signals.

What has been described, then is a new method and apparatus for transferring messages between central communication stations and one or more remote, mobile, transceivers which allows low cost mass production of terminal equipment which achieves a high performance level in a variety of interference environments.

The foregoing description of preferred embodiments has been presented for purposes of illustration and description. It is not intended to be exhaustive nor to limit the invention to the precise form disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What we claim is:

1. A communication system for transferring messages between central communication stations and one or more of a plurality of mobile terminals through Earth orbital relay satellites, comprising:

at least one central communication station having first transceiver means for transmitting a first communication signal in the form of Time Division Multiplexed communication signals, which comprise a series of N channels which are separated into A address channels and D data channel;

said central communication station further comprising:

receiver assignment means for detecting which of said plurality of mobile terminals each message is directed to;

channel assignment means for assigning at least one channel to each of said messages at a time from said D channels;

address control means for transferring a terminal address and an associated channel assignment onto one of said A channels in response to input messages intended for a corresponding terminal; and message input means connected to said channel assignment means for receiving digital messages and transferring said messages onto said D channels in response to an assignment from said channel assignment means; and at least one mobile terminal having second transceiver means for receiving and demodulating said first communication signal, and for transmitting at a predetermined transmit duty cycle, second communication signals to at least one of said central communication stations.

2. The system of claim 1 wherein said central communication station further comprises:

at least one narrow beam antenna; and conversion means for converting information to be transmitted to each corresponding terminal into digital messages at a predetermined transfer rate.

3. The communication system of claim 1 wherein said predetermined duty cycle for said second transceiver comprises a fifty percent duty cycle.

4. The communication system of claim 3 wherein said fifty percent duty cycle comprises a period on the order of 10-20 milliseconds.

5. The communication system of claim 1 wherein said second transceiver means further comprises data modulation means for applying a direct spread spectrum coding function to message data of said second communication signals.

6. The communication system of claim 5 wherein said at least one central communication station first transceiver means further comprises modulation means for modulating a carrier wave with said messages and said carrier wave is a periodic triangle wave in frequency with respect to time.

7. The communication system of claim 1 wherein said at least one central communication station first transceiver means further comprises modulation means for modulating a carrier wave with said messages and said carrier wave is a periodic triangle wave in frequency with respect to time.

8. The system of claim 7 wherein said carrier wave has a center frequency variation on the order of 2 megahertz peak-to-peak and a period on the order of 30.24 milliseconds.

9. A communication system for transferring messages between central communication stations and one or more of a plurality of mobile terminals through Earth orbital relay satellites, comprising:
　at least one central communication station having transceiver means for transmitting a first communication signal; and
　at least one mobile terminal having second transceiver means for receiving and demodulating said first communication signal, and for transmitting at a predetermined transmit duty cycle, second communication signals to at least one of said central communication stations, said second transceiver means having a demodulator/modulator apparatus, comprising:
　up/down conversion means for converting received signals at extra high frequencies to a first preselected intermediate frequency range and for converting signals to be transmitted from said first intermediate frequency range to said extra high frequencies;
　a tunable band pass filter connected in series with said up/down conversion means, said tunable band pass filter capable of having a preselected band pass range tuned in response to a control signal;
　a power signal splitter connected at a first input/output port in series with said tunable band pass filter;
　a first mixer connected at a first input to a second input/output port of said signal splitter;
　a coarse frequency synthesizer connected to said first mixer at a second input;
　a second band pass filter connected in series with an output of said first mixer;
　a second mixer connected in series with said second band pass filter and connected thereto at a first input;
　a fine frequency synthesizer connected to said second mixer at a second input;
　a crystal output filter connected to an output of said second mixer;
　a third mixer connected at a first input to said fine synthesizer and at a second input to said coarse synthesizer, having an output connected to a third input/output port of said power splitter; and
　transmit modulation means connected to said fine synthesizer for modulating a frequency input thereof in response to transmission of desired message signals.

10. A communication system for transferring messages between central communication stations and one or more of a plurality of mobile terminals through Earth orbital relay satellites, comprising:
　at least one central communication station having first transceiver means for modulating a carrier wave of preselected frequency components with said messages and for transmitting a resulting signal as a first communication signal; and
　at least one mobile terminal having second transceiver means for receiving, demodulating, and detecting transmission characteristics of said first communication signal, and for transmitting at a predetermined transmit duty cycle during a preselected transmit and receive period, second communication signals to at least one of said central communication stations, and for adjusting transmission characteristics of said second communication signals in response to said first communication signal detected transmission characteristics, and wherein said second transceiver means further comprises data modulation means for applying a direct spread spectrum coding function to message data of said second communication signals.

11. The communication system of claim 10 wherein said predetermined duty cycle for said second transceiver means comprises a fifty percent duty cycle.

12. The communication system of claim 11 wherein said fifty percent duty cycle comprises a period on the order of 10-20 milliseconds.

13. The communication system of claim 10 wherein said at least one central communication station first transceiver means transmits Time Division Multiplexed communication signals which comprise a series of N channels which are separated into A address channels and D data channels.

14. The communication system of claim 10 wherein said data modulation means is further for modulating said spread spectrum coded message data upon a frequency hopped carrier wave.

15. The communication system of claim 14 wherein said at least one central communication station first transceiver means further comprises modulation means for modulating said carrier wave with said messages and said carrier wave is a periodic triangle wave in frequency with respect to time.

16. The communication system of claim 15 wherein said carrier wave has a center frequency variation on the order of 2 megahertz peak-to-peak and a period on the order of 30.24 milliseconds.

17. The communication system of claim 15 wherein said second transceiver means further comprises adjustment means for adjusting said transmit duty cycle to zero when said first communication signal reception degrades below a desired level.

18. The communication system of claim 10 wherein said at least one central communication station first transceiver means further comprises modulation means for modulating said carrier wave with said messages and said carrier wave is a periodic triangle wave in frequency with respect to time.

19. The communication system of claim 18 wherein said carrier wave has a center frequency variation on the order of 2 megahertz peak-to-peak and a period on the order of 30.24 milliseconds.

20. The communication system of claim 10 wherein said second transceiver means further comprises adjustment means for adjusting said transmit duty cycle to zero when said first communication signal reception degrades below a desired level.

21. A communication system for transferring messages between central communication stations and one or more of a plurality of mobile terminals through Earth orbital relay satellites, comprising:
　at least one central communication station having first transceiver means for modulating a carrier wave of preselected frequency components with said messages and for transmitting a resulting signal as a first communication signal;
　at least one mobile terminal having second transceiver means for receiving, demodulating, and detecting transmission characteristics of said first communication signal, and for transmitting at a predetermined transmit duty cycle during a preselected transmit and receive period, second communication signals to at least one of said central communication stations, and for adjusting transmission characteristics of said second communication signals in response to said first communication signal detected transmission characteristics; and wherein said at least one central communication station first transceiver means further comprises modulation means for modulating said carrier wave with said messages and said carrier wave is a periodic triangle wave in frequency with respect to time.

22. The communication system of claim 21 wherein said carrier wave has a center frequency variation on the order of 2 megahertz peak-to-peak and a period on the order of 30.24 milliseconds.

23. The communication system of claim 21 wherein said predetermined duty cycle for said second transceiver means comprises a fifty percent duty cycle.

24. The communication system of claim 23 wherein said fifty percent duty cycle comprises a period on the order of 10–20 milliseconds.

25. The communication system of claim 21 wherein said at least one central communication station first transceiver means transmits and receives Time Division Multiplexed communication signals which comprise a series of N channels which are separated into A address channels and D data channels.

26. A communication system for transferring messages between central communication stations and one or more of a plurality of mobile terminals through Earth orbital relay satellites, comprising:

at least one central communication station having first transceiver means for modulating a carrier wave of preselected frequency components with said messages and for transmitting a resulting signal as a first communication signal; and at least one mobile terminal having second transceiver means for receiving, demodulating, and detecting transmission characteristics of said first communication signal, and for transmitting at a predetermined transmit duty cycle during a preselected transmit and receive period, second communication signals to at least one of said central communication stations, and for adjusting transmission characteristics of said second communication signals in response to said first communication signal detected transmission characteristics, and wherein said second transceiver means further comprises adjustment means for adjusting said transmit duty cycle to zero when said first communication signal reception degrades below a desired level.

27. The communication system of claim 26 wherein said predetermined duty cycle for said second transceiver means comprises a fifty percent duty cycle.

28. The communication system of claim 27 wherein said fifty percent duty cycle comprises a period on the order of 10–20 milliseconds.

29. The communication system of claim 17 wherein said at least one central communication station first transceiver means transmits and receives Time Division Multiplexed communication signals which comprise a series of N channels which are separated into A address channels and D data channels.

30. A method of transferring messages between central communication stations and one or more of a plurality of mobile terminals through one or more Earth orbital relay satellites, comprising the steps of:

modulating a carrier wave comprising preselected frequency components with said messages to form a first communication signal;

transmitting said first communication signal from at least one central communication station through said satellites;

receiving and demodulating said first communication signal at said one or more mobile terminals with a transceiver to produce at least one message;

tracking and substantially locking onto locations of said satellites using said first communication signal during reception;

directing signal transmission from said transceiver to said satellites according to acquired tracking information for signal reception direction; and transmitting at a predetermined transmit duty cycle, a second communication signal from said transceiver to said central communication stations through said locked on and tracked satellites.

31. The method of claim 30 further comprising the steps of dynamically adjusting a period of said transmit duty cycle is in response to transmission characteristics of said first communication signal; and adjusting said transmission duty cycle to zero when said first signal reception degrades below a desired level.

32. The method of claim 30 wherein said step of modulating said carrier wave further comprises the steps of:

providing digital message data;

providing a carrier wave triangular in frequency with respect to time; and wherein said carrier wave is modulated with said digital message data.

33. The method of claim 32 wherein said carrier wave has a center frequency variation on the order of 2 megahertz peak-to-peak and a period on the order of 30.24 milliseconds.

34. The method of claim 30 wherein said step of transmitting said second communication signal comprises the steps of:

providing digital message data;

modulating said digital message data with a direct spread spectrum coding function to produce a spread spectrum data signal; and modulating a transceiver carrier wave with said spread spectrum data signal.

35. The method of claim 34 further comprising the step of hopping the frequency of said second communication signal in a predetermined pattern at a predetermined rate.

36. The method of claim 30 wherein said preselected frequency components comprise frequency hopped carrier frequencies.

37. The method of claim 30 wherein said predetermined duty cycle comprises a fifty percent duty cycle.

38. The method of claim 30 wherein said carrier wave modulation steps further comprises the step of formatting said first communication signal as a Time Division Multiplexed communication signal, which comprise a series of N channels which are separated into A address channels and D data channels.

39. The method of claim 38 further comprising the steps of:

detecting which of said plurality of terminals each message is directed to:

assigning at least one channel to each of said messages at a time from said D channels;

transferring a terminal address and an associated channel assignment onto one of said A channels in response to input messages intended for a corresponding terminal; and receiving digital messages and transferring said messages onto said D channels in response to a current channel assignment for each message.

40. The method of claim 30 further comprising the steps of:

converting information to be transmitted to a central station into a digital message at a predetermined transfer rate; and transferring said second communication signal through at least one narrow-beam antenna to at least one of said satellites.

41. The method of claim 30 wherein said second transceiver demodulating and modulating steps comprise the steps of:

converting received first communication signals at extra high frequencies to a first preselected intermediate frequency range during predefined reception periods;

filtering intermediate range frequency signals with a tunable band pass filter capable of having a preselected band pass range tuned in response to a control signal;

generating a predetermined coarse carrier frequency component with a coarse frequency synthesizer;

mixing received first intermediate frequency range signals with said coarse carrier to produce second intermediate range signals;

generating a predetermined fine carrier frequency component with a fine frequency synthesizer;

mixing received second intermediate frequency range signals with said fine carrier to produce a receiver output signal;

modulating an output frequency for said fine frequency synthesizer with message signal data during predefined transmission periods to produce message signals at third intermediate frequencies;

mixing message signals to be transmitted with said coarse carrier frequency components to produce an intermediate frequency second communication signal; and converting second communication signals to be transmitted from said first intermediate frequency range to said extra high frequencies during said predefined transmission periods.

42. The method of claim 41 wherein said fine frequency synthesizer is modulated with a local oscillator frequency that is modulated to produce a triangular varying waveform.

43. The method of claim 41 wherein said fine frequency synthesizer is a direct digital synthesizer which is modulated with digital message data.

44. The method of claim 41 wherein said fine frequency synthesizer is modulated with digital message data that is first modulated with a direct spread spectrum coding function.

45. The method of claim 41 further comprising the step of filtering said receiver output signal with a crystal output filter.

46. A demodulator/modulator apparatus for use in communication transceivers, comprising: up/down conversion means for converting received signals at predetermined high frequencies to a first preselected intermediate frequency range and for converting signals to be transmitted from said first intermediate frequency range to said predetermined high frequencies;

a tunable band pass filter connected in series with said up/down conversion means, said tunable band pass filter capable of having a preselected band pass range tuned in response to a control signal;

a power signal splitter connected at a first input/output port in series with said tunable band pass filter;

a first mixer connected to a second input/output port of said signal splitter;

a coarse frequency synthesizer connected to said first mixer;

a second band pass filter connected in series with an output of said first mixer;

a second mixer connected in series with said second band pass filter;

a fine frequency synthesizer connected to said second mixer at a second input;

a crystal output filter connected to an output of said second mixer;

a third mixer connected at a first input to said fine synthesizer and at a second input to said coarse synthesizer, having an output connected to a third input/output port of said power splitter; and transmit modulation means connected to said fine synthesizer for modulating a frequency input thereof in response to transmission of desired communication signals.

47. The apparatus of claim 46 wherein said transmit modulation means comprises carrier means for generating a periodic carrier triangularly shaped with respect to frequency over time for modulation of said fine synthesizer frequency.

48. The apparatus of claim 46 further comprising spread spectrum means connected to said fine frequency synthesizer for modulating message data with a direct spread spectrum coding function.

49. A communication system for transferring messages between central communication stations and more or more of a plurality of mobile terminals through Earth orbital relay satellites, comprising:

at least one central communication station each having first transceiver means for, generating Time Division Multiplexed data from ones of said messages, modulating said data upon a first carrier wave wherein said first carrier wave is a periodic triangle wave in frequency with respect to time, and transmitting said data modulated first carrier wave as a first communication signal; and at least one mobile terminal each having second transceiver means for, receiving said first communication signal, demodulating said received first communication signal, providing from said demodulated first communication signal certain ones of said messages intended for a corresponding one of said mobile terminals, spread spectrum modulating other ones of said messages, and transmitting said spread spectrum modulated messages as a second communication signal to at least one of said central communication stations, said second transceiver means receiving and transmitting respectively during alternating sequential receive and transmit periods.

50. The communication system of claim 49 wherein second communication signal is a frequency hopped second carrier wave modulated by said other ones of said messages.

51. The communication system of claim 50 wherein second communication signal is a frequency hopped second carrier wave modulated by direct sequence spread spectrum coded other ones of said messages.

52. The communication system of claim 49 wherein said second communication signal is a second carrier wave modulated by direct sequence spread spectrum coded other ones of said messages.

53. The communication system of claim 49 wherein said first transceiver means is further for, receiving said second communication signal, demodulating said received second communication signal, and providing from said demodulated second communication signal said other ones of said messages from a corresponding one of said mobile terminals.

54. The communication system of claim 49 wherein said second transceiver means transmits at a fifty percent duty cycle.

55. The communication system of claim 54 wherein said fifty percent duty cycle comprises a period on the order of 10-20 milliseconds.

56. The communication system of claim 49 wherein each frame of said Time Division Multiplexed data is comprised a series of N channels which are separated into A address channels and D data channels.

57. The communication system of claim 49 wherein said second transceiver means receives at a one hundred percent duty cycle until said first communication signal is received and prior to transmission of said second communication signal.

58. The communication system of claim 49 wherein said central communication system generates and transmits mobile terminal response timing information in said first communication signal, each mobile terminal responsive to corresponding mobile terminal response timing information for transmitting said second communication signal at a respective time.

* * * * *